United States Patent
Gai

(10) Patent No.: US 7,351,612 B2
(45) Date of Patent: Apr. 1, 2008

(54) METHOD FOR FABRICATING QUAD FLAT NON-LEADED PACKAGE

(75) Inventor: Yung-Feng Gai, Kaohsiung (TW)

(73) Assignee: Advance Semiconductor Engineering Inc., Kaohsiung (TW)

( * ) Notice: Subject to any disclaimer, the term of this patent is extended or adjusted under 35 U.S.C. 154(b) by 76 days.

(21) Appl. No.: 11/248,173

(22) Filed: Oct. 13, 2005

(65) Prior Publication Data
US 2006/0084203 A1  Apr. 20, 2006

(30) Foreign Application Priority Data
Oct. 15, 2004  (TW) .............................. 93131301 A

(51) Int. Cl.
*H01L 21/00* (2006.01)
(52) U.S. Cl. .................. 438/117; 438/126; 257/666; 257/667; 257/670; 257/787
(58) Field of Classification Search ................ 438/117, 438/126; 257/666, 676, 670, 787, 796
See application file for complete search history.

(56) References Cited

U.S. PATENT DOCUMENTS

| | | | |
|---|---|---|---|
| 6,166,430 A * | 12/2000 | Yamaguchi | 257/666 |
| 6,198,171 B1 * | 3/2001 | Huang et al. | 257/787 |
| 6,420,779 B1 * | 7/2002 | Sharma et al. | 257/666 |
| 6,861,295 B2 * | 3/2005 | Jung et al. | 438/124 |
| 6,881,611 B1 * | 4/2005 | Fukasawa et al. | 438/114 |
| 6,969,640 B1 * | 11/2005 | Dimaano Jr. et al. | 438/122 |
| 2002/0027265 A1 * | 3/2002 | Yoneda et al. | 257/666 |

* cited by examiner

*Primary Examiner*—George R. Fourson
*Assistant Examiner*—John M. Parker
(74) *Attorney, Agent, or Firm*—Birch, Stewart, Kolasch & Birch, LLP

(57) ABSTRACT

The present invention discloses a method for fabricating a quad flat non-leaded package. A lead frame is disposed on a lower mold equipped with a resilient film. The lead frame includes at least a package unit comprising a chip pedestal and a plurality of pins spatially disposed around the chip pedestal. An upper mold corresponding to the lower mold is provided over the lead frame for encapsulation. The upper mold is pressed to form a protrusion from a resilient film between the chip pedestal and the pins, and then the chip pedestal and the pins are encapsulated by a molding material. The resilient film is removed to form a QFN structure with the lead frame protruding from the molding material.

8 Claims, 5 Drawing Sheets

METHOD FOR FABRICATING QUAD FLAT NON-LEADED PACKAGE

BACKGROUND

The present invention relates to a method of encapsulating a quad flat non-leaded (QFN) package, andmore particularly to a method of encapsulating a quad flat non-leaded package with the lead frame protruding from the molding material.

With increased improvement in semiconductor technology, operating speed and design complexity thereof are continuously increased. To respond to the needs of improved semiconductor technology, efficient semiconductor packing technologies are desirable, such as high-density packaging. The QFN package is one popular of low-pin-count high-density package type.

A conventional QFN package typically comprises a lead frame based chip size package (CSP). The leadless CSP is popularly employed in low-pin-count packages due to advantages such as shortened signal trace enhancing signal decay.

FIG. 1 is a cross-sectional view of a conventional quad flat non-leaded package. FIG. 1A is a bottom view of the conventional quad flat non-leaded package shown in FIG. 1. A conventional QFN package 100 comprises a chip 110, a chip pedestal 132, several pins 138, a molding material 150. The chip 110 includes an active surface 112 having several bonding pads 116 thereon. The chip pedestal 132 has an upper surface 134 and a bottom surface 136. The pins 138 also have an upper surface 140 and a bottom surface 142. The rear surface 114 of the chip 110 is attached to the upper surface 134 of the chip pedestal 132. The leads 144 are electrically connected to the bonding pads 116 and pins 138, respectively. In addition, the molding material 150 covers the chip 100, the leads 144, the upper surface 134 of the chip pedestal 132, the upper surface 140 of the pins 138. Ideally, the bottom surface 136 of the chip pedestal 132 and bottom surface 142 of the pins 138 are exposed.

In a conventional method for encapsulating a quad flat non-leaded package, the bottom surface 136 of the chip pedestal 132 and bottom surface 142 of the pins 138 are attached to a adhesive tape (not shown) fixed on a supporter. The chip 110 is than attached to the upper surface 134 of the chip pedestal 132 in contact with the rear surface 114 of the chip 110. A wire bonding is performed, electrically connecting the bonding pads 116 to the pins 138 through the leads 144. Encapsulation, removal of the adhesive tape and formation of the pins are subsequently performed.

FIG. 2 is a cross-sectional view of encapsulation of a conventional quad flat non-leaded package. As shown in FIGS. 1A and 2, high flowing rate and high temperature the molten molding material 150 facilitate peeling between the tape 160 and bottom surface 136 of the chip pedestal 132, thus, a gap 170 is formed. Meanwhile, the molten molding material 150 enters the gap 170, resulting in molding material spills 180. Accordingly, an extra polishing is needed to remove the molding material spills 180, thus process complexity is increased. Additionally, a heat-resistant tape must be employed to withstand high temperatures of over 200° C. The heat-resistant tape increases costs and easily leaves residual molding material on the lead frame, contaminating the lead frame.

Accordingly, a more reliable encapsulation of a quad flat non-leaded (QFN) package, capable of avoiding molding material spills, residual molding material contamination, and reducing process time and costs, is desirable.

SUMMARY

To solve the described problems such as molding material spills during encapsulation and to facilitate reduction of processing time and cost, a method of encapsulating a quad flat non-leaded package are provided.

A non-adhesive resilient film is provided by one embodiment of the invention to prevent residual molding material from contaminating the lead frame after removal of the adhesive tape.

A quad flat non-leaded package with the lead frame protruding from the molding material is provided by another embodiment of the invention to enhance adhesion between itself and the printed circuit board (PCB).

The method comprises providing a lower mold. A resilient film is disposed on the lower mold. A lead frame comprising at least a package unit is disposed on the resilient film, wherein the package unit comprises a chip pedestal and a plurality of pins spatially disposed around the chip pedestal. An upper mold corresponding to the lower mold is provided on the lead frame, forming a die. The upper mold is pressed to form protruding portions from the resilient film between the chip pedestal and the pins. A molding material is placed in the die to encapsulate the chip pedestal and the pins. The resilient film is removed, forming a quad flat non-leaded package where the lead frame protrudes from surfaces of the molding material.

A detailed description is given in the following embodiments with reference to the accompanying drawings.

DESCRIPTION OF THE DRAWINGS

The invention can be more fully understood by reading the subsequent detailed description and examples with references made to the accompanying drawings, wherein.

DETAILED DESCRIPTION

FIGS. 3 to 8 are cross-sectional views of encapsulation of a quad flat non-leaded package according to an embodiment of the invention. The method comprises the following steps.

Figure 1:
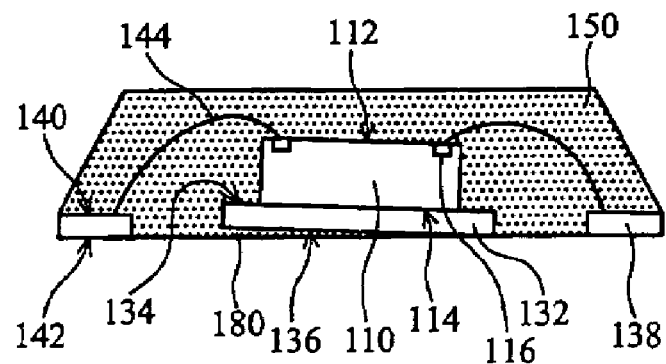
FIG. 1 is a cross-sectional view of a conventional quad flat non-leaded package.
Figure 1A:
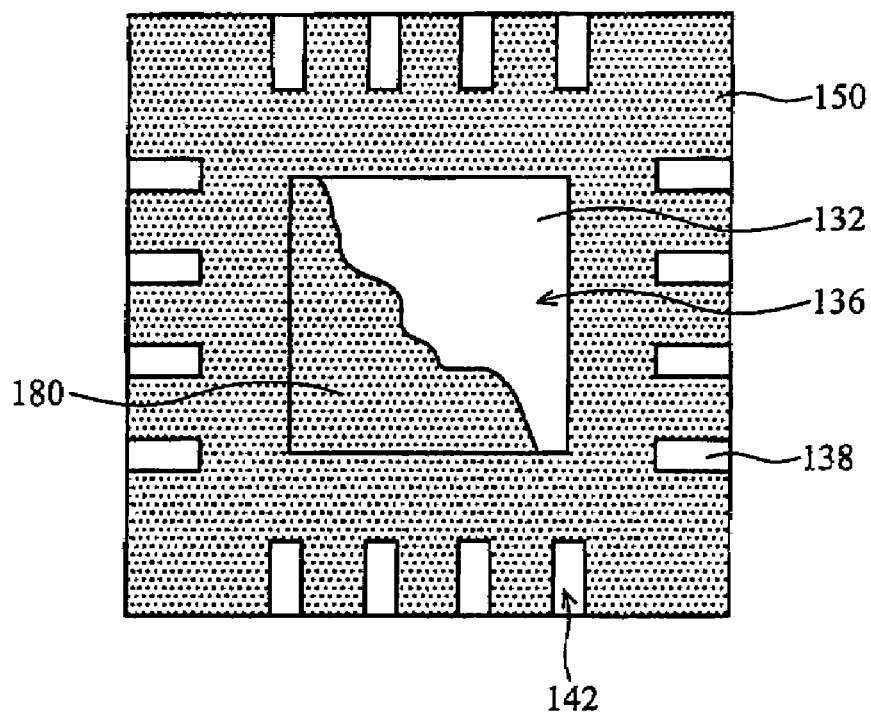
FIG. 1A is a bottom view of the conventional quad flat non-leaded package shown in FIG. 1.
Figure 2:
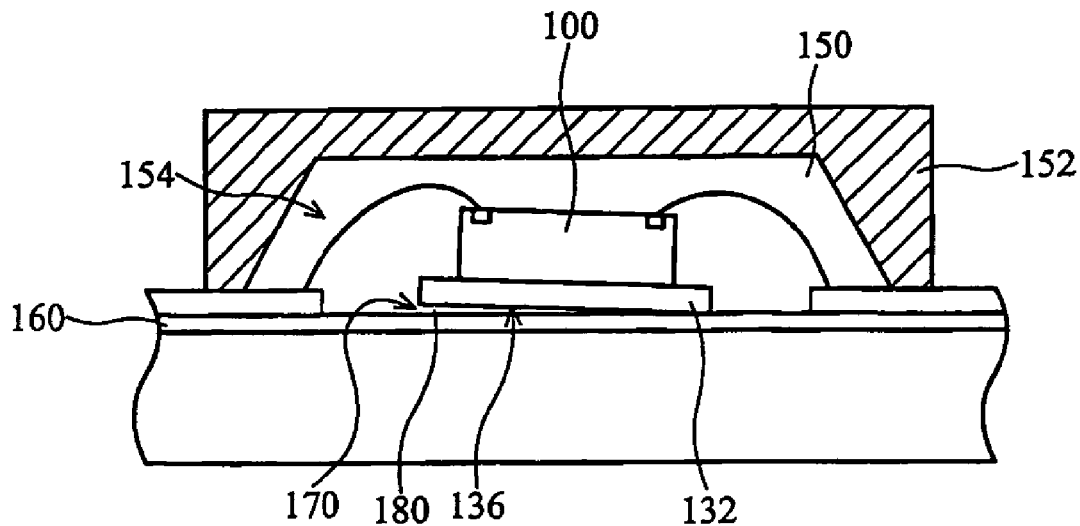
FIG. 2 is a cross-sectional view of encapsulation of a conventional quad flat non-leaded package.
Figure 3:
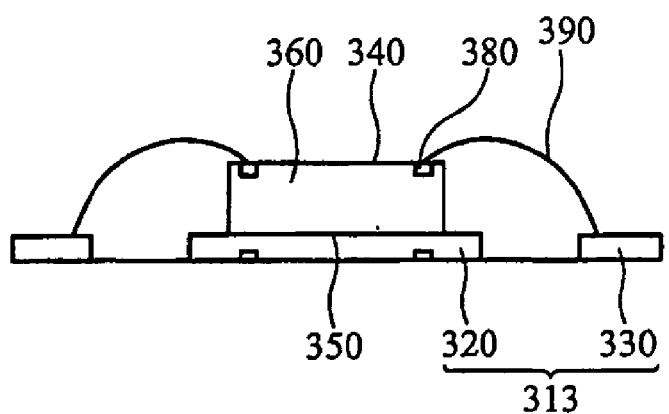
FIG. 3 is a scheme of a lead frame and devices formed thereon according to an embodiment of the invention.
Figure 4:
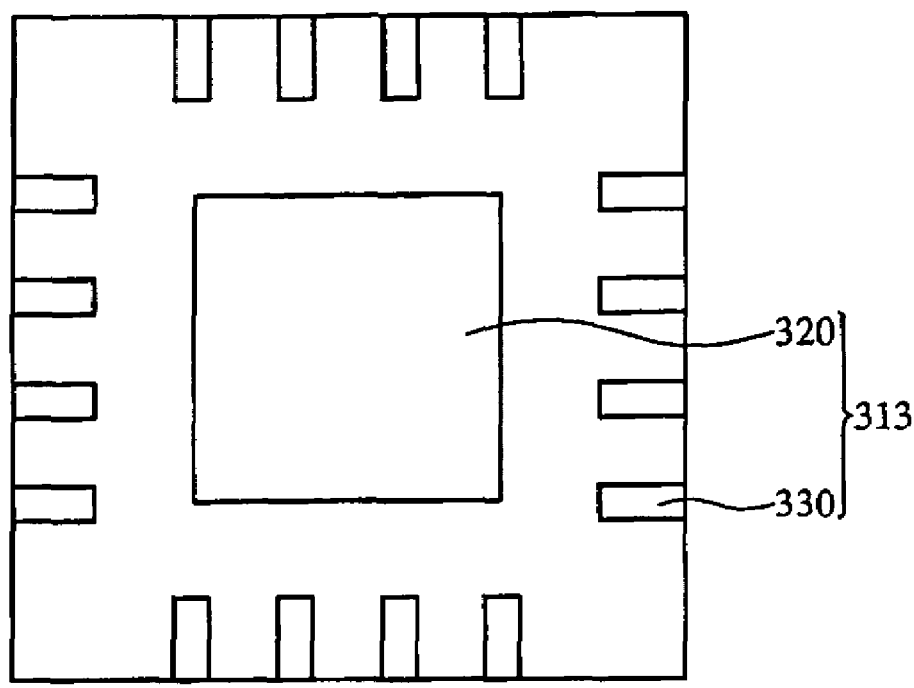
FIG. 4 is a bottom view of the lead frame and devices formed thereon shown in FIG. 3.

FIG. 3 is a schematic diagram of a lead frame and devices formed thereon according to an embodiment of the invention. FIG. 4 is a bottom view of the lead frame and devices formed thereon shown in FIG. 3. As shown in FIGS. 3 and 4, a lead frame 313 comprising at least a package unit 300 is provided, wherein the package unit 300 comprises a chip pedestal 320 and a plurality of pins 330 spatially disposed around the chip pedestal 360. A chip 360 comprising an active surface 340 and a rear surface 350 corresponding thereto is disposed on the chip pedestal 320, wherein the active surface 340 comprises a plurality of bonding pads 380 thereon. The pins 330 are electrically connected to the bonding pads 380 by means of bonding wires 390.

The lead frame 313 is selected from a group of Cu, Al, CuAl alloy, Al alloy and combinations thereof. The pins 330, for example metal pads, comprise an anti-oxidation metal layer formed thereon by plating or electroless plating. The anti-oxidation metal layer is selected from a group of Au, Ni, Pd, Ag, Sn, Ni/Pd, Cr/Ti, Ni/Au, Pd/Au, Ni/Pd/Au and combinations thereof. The bonding wires 390 preferably comprise Au.

Figure 5:
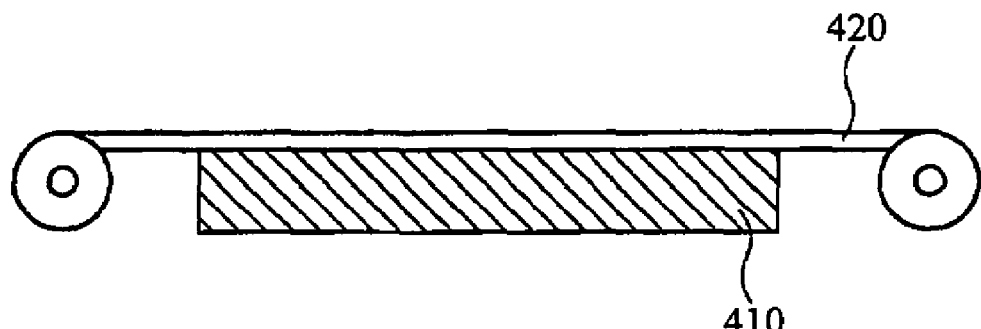
FIGS. 5 to 7 are cross-sectional views of encapsulation of a quad flat non-leaded package according to an embodiment of the invention.

As shown in FIG. 5, a lower mold 410 is provided. A resilient film 420 unrolled from a roller 425 is disposed on the lower mold 410. The resilient film 420 has a thickness between about 30 to 80 µm, preferably more than 50 µm. The resilient film 420 comprises heat-resistant materials capable of withstanding a temperature of up to 170° C., for example adhesive or non-adhesive tapes. In a preferred embodiment, non-adhesive tape is employed, preventing the residual molding material from contaminating the lead frame during subsequent removal of the adhesive tape.

Figure 6:
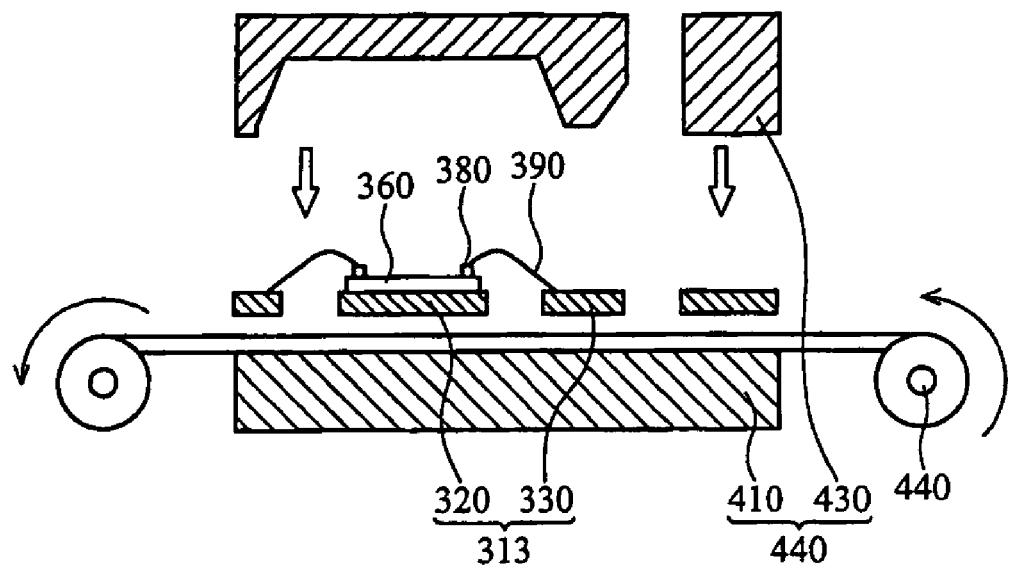

As shown in FIG. 6, the lead frame 300 shown in FIG. 3 is set on the resilient film 420. A die 440 is completed by placement of an upper mold 430 corresponding to the lower mold 410 on the lead frame 300.

Figure 7:
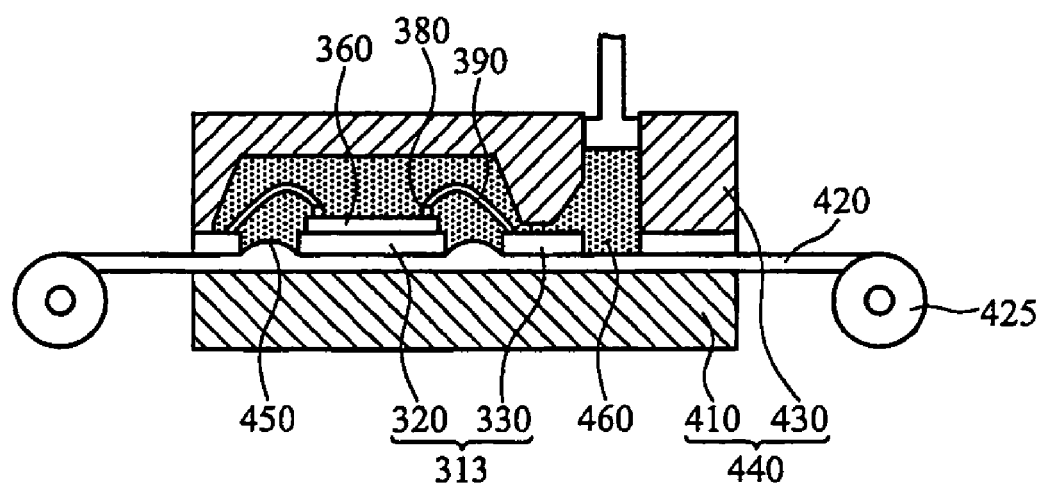

As shown in FIG. 7, this embodiment features formation of protruding portions 450 from the resilient film, by pressing the upper mold 430, between the chip pedestal 320 and the pins 330. With increased pressure, a forward force is induced to tightly attach the resilient film 420 to the lead frame 313, thereby avoid molding material spills during subsequent encapsulation and facilitate reduction of processing time and cost.

As shown in FIG. 7, a molding material 460 is placed in the die 440 to encapsulate the chip 360, the chip pedestal 320, the pins 330 and the bonding wires 390. The molding material 460 is selected from a group of silica gel, epoxy resin, and polyimide.

Figure 8:
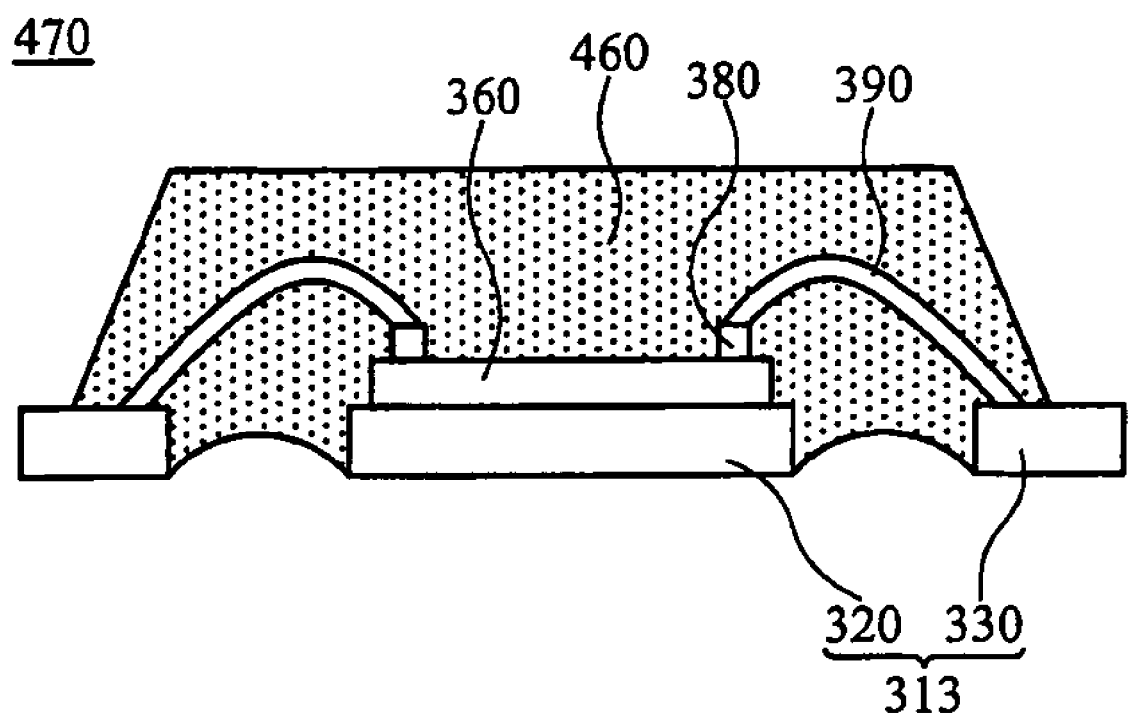
FIG. 8 is across-sectional viewof aquad flat non-leaded package according to an embodiment of the invention.

As shown in FIG. 8, the used resilient film 420 is removed i.e. rolled up by the roller 425, forming a quad flat non-leaded package 470 where the lead frame 313 protrudes from surfaces of the molding material 460. Such QFN package 470 successfully increases contact area between itself and a PCB, thus adhesion therebetween is enhanced.

As described, the method of encapsulating a QFN package of the embodiment of the invention has the following advantages.

First, formation of protruding portions from the resilient film avoids molding material spills during subsequent encapsulation, facilitating reduction of processing time and cost. Second, the provided non-adhesive resilient film prevents the residual molding material from contaminating the lead frame during removal of the adhesive tape. Third, a QFN package with the lead frame protrudeing from surfaces of the molding material successfully increases the contact area between itself and a PCB, thus adhesion therebetween is enhanced.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A method of encapsulating a quad flat non-leaded package, comprising:
   providing a lower mold;
   disposing a resilient film that is a non-adhesive tape on the lower mold;
   disposing a lead frame comprising at least one package unit on the resilient film that has been disposed on the lower mold, wherein the package unit comprises a chip pedestal and a plurality of pins spatially disposed around the chip pedestal;
   providing an upper mold corresponding to the lower mold on the lead frame, forming a die;
   pressing the upper mold, forming protruding portions from the resilient film between the chip pedestal and the pins;
   placing a molding material in the die, encapsulating the chip pedestal and the pins; and
   removing the resilient film, forming a quad flat non-leaded package where the lead frame protrudes from surfaces of the molding material.

2. The method as claimed in claim 1, wherein the resilient film comprises heat-resistant materials.

3. The method as claimed in claim 1, wherein the resilient film is unrolled from a first roller and the used resilient film is rolled up by a second roller.

4. The method as claimed in claim 1, wherein a chip comprising an active surface and a rear surface corresponding thereto is disposed on the chip pedestal, wherein the active surface comprises a plurality of bonding pads thereon.

5. The method as claimed in claim 4, wherein the pins are electrically connected to the bonding pads.

6. The method as claimed in claim 1, wherein on the pins comprise an anti-oxidation metal layer selected from a group of Au, Ni, Pd, Ag, Sn, Ni/Pd, Cr/Ti, Ni/Au, Pd/Au, Ni/Pd/Au and combinations thereof.

7. The method as claimed in claim 1, wherein the lead frame is selected from a group of Cu, Al, CuAl alloy, Al alloy and combinations thereof.

8. The method as claimed in claim 1, wherein the molding material is selected from a group of silica gel, epoxy resin, polyimide.

* * * * *